United States Patent
Tsukamoto

(10) Patent No.: US 7,176,145 B2
(45) Date of Patent: Feb. 13, 2007

(54) MANUFACTURING METHOD OF SEMICONDUCTOR DEVICE

(75) Inventor: Takeo Tsukamoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 189 days.

(21) Appl. No.: 10/763,337

(22) Filed: Jan. 26, 2004

(65) Prior Publication Data

US 2004/0152337 A1 Aug. 5, 2004

(30) Foreign Application Priority Data

Jan. 27, 2003 (JP) ............................. 2003-017833

(51) Int. Cl.
H01L 21/31 (2006.01)
H01L 21/469 (2006.01)

(52) U.S. Cl. ...................... 438/763; 438/761; 438/764; 438/758; 438/692

(58) Field of Classification Search ................ 438/256, 438/399, 478, 761, 763, 764, 758, 787, 692
See application file for complete search history.

(56) References Cited

U.S. PATENT DOCUMENTS

| | | | | |
|---|---|---|---|---|
| 4,916,087 A | * | 4/1990 | Tateoka et al. | 438/427 |
| 6,818,539 B1 | * | 11/2004 | Kanda | 438/612 |
| 6,936,478 B2 | * | 8/2005 | Tani et al. | 438/3 |
| 2002/0068452 A1 | * | 6/2002 | Homma et al. | 438/690 |

FOREIGN PATENT DOCUMENTS

| | | |
|---|---|---|
| JP | 6-252112 | 9/1994 |
| JP | 9-153494 | 6/1997 |
| JP | 10-64859 | 3/1998 |
| JP | 10-79423 | 3/1998 |
| JP | 11-145090 | 5/1999 |
| JP | 2000-31163 | 1/2000 |
| JP | 2000-36533 | 2/2000 |
| JP | 2000-156360 | 6/2000 |
| JP | 2001-85373 | 3/2001 |
| JP | 2002-208636 | 7/2002 |

* cited by examiner

Primary Examiner—Zandra V. Smith
Assistant Examiner—Thanh Y. Tran
(74) Attorney, Agent, or Firm—McGinn IP Law Group, PLLC

(57) ABSTRACT

In forming a high density plasma oxide film, a projection shaped like the mesa, the peaked roof, the cone or the like is formed on an element formation region. This projection gives rise to a problem of producing a polishing scar when the CMD (Chemical Mechanical Polishing) with a ceria slurry is performed. A film having a polishing rate equivalent to the one of the high density plasma oxide film is formed on the high density plasma oxide film to reinforce a projection in the shape of a triangular prism, a cone or such, and, thereafter, the polishing is carried out, using a ceria slurry. In another method, after the first CMP polishing is performed, using a silica slurry containing grains of small particle size which make no aggregation, the second CMP polishing is performed, using a ceria slurry.

18 Claims, 7 Drawing Sheets

Reducing effect of additional growth of oxide film
on scooped-mark-like polishing scar Reducing effect
on scooped-mark-like polishing scar

MANUFACTURING METHOD OF SEMICONDUCTOR DEVICE

BACKGROUND OF THE INVENTION

1. Field of the Invention

The present invention relates to a manufacturing method of a semiconductor device.

2. Description of the Related Art

As the insulating film in the semiconductor device, the silicon oxide film has been being used for various purposes and its application range includes the Trench Isolation, the interconnection interlayer film and the like. However, in recent years, accompanying the miniaturization of the semiconductor device, it has become demanded that the deposition thereof gives still better performance for filling up the pattern and the chemical mechanical polishing (referred to as the CMP (Chemical Mechanical Polishing) polishing hereinafter) that is the fabrication technique therefor has a higher controllability and uniformity.

As the silicon oxide film of excellent filling-up capability, a high density plasma CVD (Chemical Vapor Deposition) oxide film (referred to as the HDP oxide film hereinafter) described in Japanese Patent Application Laid-open No. 079423/1998 and the like has been currently in wide use.

The deposition of the film by the high density plasma CVD method is a technique in which the deposition of the film and the sputtering are simultaneously carried out so as to bury the difference in level of the uneven film surface. This technique excels in filling-up capability but leaves the film in characteristic form having, on the top of each upper level section thereof, a projection shaped like the mesa, the peaked roof or the cone (referred to as a projection hereinafter).

For the CMP polishing of the oxide film, the use of alumina, zirconia or silica slurry has been examined but the silica slurry with a selection ratio of the polishing rate of 4 or so (silicon oxide film/silicon nitride film) is generally utilized. The silicon slurry, however, allows the nitride film that acts as a stopper film at the time of polishing to be polished so that a slurry having a higher selection ratio of the polishing rate and a higher controllability than the silica slurry has been called for. On the other hand, although alumina, zirconia and silica slurry have the disadvantage of low selection ratio of the polishing rate, their grain sizes are as small as 0.2 μm and their grains make no aggregation, thus, causing few polishing scars even when projections are present as on the surface of the HDP oxide film.

As the CMP polishing of good controllability, the CMP polishing described in Japanese Patent Application Laid-open No. 085373/2001, wherein a polishing agent containing cerium oxide (ceria) as grains (referred to as a ceria slurry hereinafter) is used has been attracting special interests.

The strong points of the CMP polishing with the ceria slurry are its high selection ratio of the polishing rate (silicon oxide film/silicon nitride film) of 20 to 60 or so which is much higher than that of the conventional silica slurry of 4 or so and its excellent planarizing performance. On the other hand, the grain size of the ceria slurry is greater than that of the silica slurry (silica slurry: the average 0.1 μm, ceria slurry: the average 0.2 μm, the maximum 1.1 μm), and, furthermore, on mixing the ceria grain agent and the additive, large particles (2 to several tens μm) are liable to appear due to aggregation. When some of grains the slurry contains, as in the ceria slurry, have grain sizes exceeding 1 μm, even if the CMP polishing is carried out immediately after the mixing, the polishing scars are produced in the presence of the projections. Moreover, the appearance of large particles through aggregation of the grains tends to increase the dimensions of the polishing scars, which is clearly a weak point for this polishing.

FIG. 7 is a series of schematic cross-sectional views of a semiconductor substrate illustrating, in sequence, the steps of a manufacturing method, taking the case of the steps of forming a trench isolation, and, herein, an example of a conventional method of applying a CMP polishing treatment with a ceria slurry to a semiconductor substrate buried under a HDP oxide film is shown.

First, as shown in FIG. 7(a), on a semiconductor substrate 25, a thermal oxide film 26 was grown to a thickness of 10 nm, and thereon a nitride film 27 was grown to a thickness of 140 nm or so by the low pressure CVD method and, then, a KrF resist 28 was formed on an element formation region by means of KrF excimer lithography.

Next, as shown in FIG. 7(b), using the KrF resist as a mask, portions of the nitride film 27 and the thermal oxide film 26 lying on the element isolation regions were removed by plasma etching so as to make the thermal oxide film 26 and the nitride film 27a remain on the element formation region selectively. After that, the KrF resist 28 was removed.

Next, as shown In FIG. 7(c), using the nitride film 27a as a mask, plasma etching was applied thereto to form trenches with a depth of 250 nm in the element isolation regions of the semiconductor substrate 25. The nitride film 27a was, hereat, etched by 40 nm to a thickness of 100 nm.

Next, as shown in FIG. 7(d), after conducting a cleaning treatment such as an acid cleaning, a HDP oxide film 29 was grown by the high density plasma CVD method to a thickness of 400 nm so as to fill up the trench sections. The HDP oxide film 29, hereat, took the shape of a long tail in the periphery of the element formation region.

The tail of the HDP oxide film 29 made an angle of 56° to the surface of the semiconductor substrate. Further, the HDP oxide film 29 over the element formation region became trapezoidal when the width of the element formation region was large. When the width of the region was less than 540 nm (=2×400/tan 56°), however, the upper side of the trapezoid disappeared and the HDP oxide film formed a projection in the shape of a peaked roof or a cone whose angle of the apex of the cross-sectional isosceles triangle was 68°.

After that, as shown in FIG. 7(e), using the nitride film 27a as a polishing stopper, the HDP oxide film 29 on the element formation region was removed by the CMP polishing with a ceria slurry and the nitride film 27a was exposed.

The ceria slurry was hereat prepared by mixing a ceria grain agent HS-8005 and an additive HS-8102GP (made by Hitachi Chemical Co. Ltd.,) in the proportion of 1:2, and a CMP apparatus MIRRA 3400 (made by Applied Materials Inc.) and a polishing pad IC 1000 (made by Rodel Nitta Company) were utilized, but, obviously, they were not limited to these particular ones. As for the detection of the end point for the CMP polishing, the optical method was hereat employed.

While the ceria slurry had the disadvantage that polishing scars were liable to be produced as described above, its polishing rate for the nitride film was as one twentieth to one sixtieth or so as fast as its polishing rate for the oxide film and, therefore, the amount of polishing the nitride film received did not exceed 5 nm, and the polishing could be certainly stopped at the nitride film, indicating a high controllability this slurry provided.

Nevertheless, on the minute element formation regions with a width of 540 nm or less, there were observed numerous polishing scars which looked like scooped marks. It was considered that, changing into large particles, grains in the ceria slurry came into collisions with the projections on the minute element formation regions and made the projection tip(s) or itself broken or made the projection ridge(s) crumble, which brought about the polishing scars. Moreover, since these scars were made in the element formation regions, their adverse effect on the element operations were substantial and directly caused the lowering of the yield.

Next, as shown in FIG. 7(f), the nitride film 27a was removed by wet etching with phosphoric acid, and thereby the formation of the trench isolation was accomplished. Typically, more than 400 polishing scars like scooped marks (per 8-inch substrate) were observed on the minute element formation regions.

When a deposition of a film of anisotropic growth with a good filling-up capability, like the high density plasma CVD, is applied onto a basic substance having a difference in level on the surface, a projection appears on the top of each upper level section thereof.

Even with the CMP being applied to a state where the projection is formed, no problem arises when grains in a slurry are small. However, once some of grains form large particles, there arises a problem of breaking the projections and producing polishing scars.

In recent years, accompanying the miniaturization of the semiconductor device, the improvement of the filling-up capability and the increase in polishing accuracy have been simultaneously demanded. To meet these demands, it is essential to develop a novel technique in which both of the deposition by the high density plasma CVD methods which excels in filling-up capability and the CMP polishing with a ceria slurry which tends to produce polishing scars, with grains changing into large particles, but provides a high selection ratio of the polishing rate between the oxide film and the nitride film are employed but the production of the polishing scars is successfully suppressed.

SUMMARY OF THE INVENTION

The present invention provide a method of manufacturing a semiconductor device; which comprises the steps of depositing, on a basic substance surface with a difference in level, a first film through an anisotropic growth; forming, through an isotropic growth, a second film having a polishing rate equivalent to or less than a polishing rate of the first film to reinforce a projection formed on the first film; and polishing the first film and the second film using a ceria slurry.

Further, the present invention provides a method of manufacturing a semiconductor device; which comprises the steps of depositing, on a basic substance surface with a difference in level, a first film through an anisotropic growth; polishing an angular section of a projection formed on the first film, using a slurry whose grains have small particle sizes; and polishing, subsequently, the first film, using a ceria slurry.

Further, the present invention provides a method of manufacturing a semiconductor device; which comprises the steps of depositing, on a basic substance surface with a difference in level, a first film through an anisotropic growth; forming, through an isotropic growth, a second film having a polishing rate equivalent to or less than a polishing rate of the first film to reinforce a projection formed on the first film; polishing a part of the first film, using a slurry whose grains have small particle sizes; and polishing, subsequently, the first film, using a ceria slurry.

DETAILED DESCRIPTION OF THE INVENTION AND PREFERRED EMBODIMENTS

Figure 1:
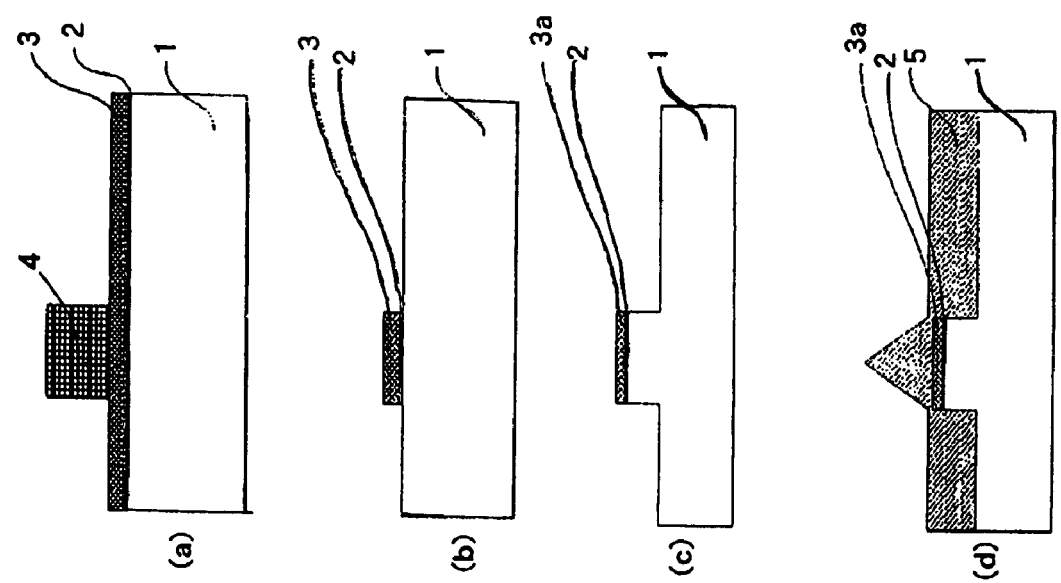
FIG. 1 is a series of schematic cross-sectional views of a semiconductor substrate illustrating the steps of First Example.

In the first embodiment of the present invention, on a basic substance to which the formation of a trench for trench isolation, an interconnection and such is applied that a difference in surface level may be formed, an oxide film, a nitride film or a nitric oxide film is formed by the highly anisotropic high density plasma CVD method, which brings about the formation of projections on this film surface so that, prior to a polishing of this film with a ceria slurry, the projecting sections are reinforced with another film formed through an isotropic growth, a polishing rate of which is equivalent to or less than that of the first film, and thereafter a polishing with a ceria slurry is applied thereto.

The film to reinforce (referred to as the reinforcing film hereinafter) the projecting sections of the HDP film can be an oxide film, a nitride film or a nitric oxide film grown by the atmospheric CVD method, the low pressure CVD method, the plasma CVD method or the like as far as the film adheres well to the HDP film and has the polishing rate equivalent to or less than that of the HDP film.

When the polishing rate for the reinforcing film is equal to or greater than double the polishing rate for the HDP film, the polishing of the reinforcing film proceeds far in advance of the polishing of the HDP film, and the projecting sections may be exposed. This exposed projecting section may be broken, while being polished, which causes the polishing scar. If the polishing rate for the reinforcing film is 1.5 times or so the polishing rate for the HDP film, no special problem arises, but it is preferable that the former is not greater than 1.2 times the latter. Meanwhile, in the case that the polishing rate for the reinforcing film is slow, the treatment time period in the step of polishing becomes long and the throughput, lowered, but the polishing scar is not produced. While a concave section is hereat formed in the central area of the HDP film, this does not cause any specific problem.

When the HDP film and the reinforcing film are both formed from the same type of oxide films, nitride films or nitric oxide films, physical characteristics of both films are almost identical and even if their deposition methods differ, their polishing rates in CMP polishing are within ±50% each other and can be regarded as the same, on the whole, but the year preferably set to be within ±20%. If the polishing rate for the reinforcing film is equal to or greater than double the polishing rate for the HDP film, the polishing of the reinforcing film proceeds far in advance and the top end section of the projection may be exposed, resulting in the appearance of the polishing scar.

With a thickness of not less than 100 nm, the reinforcing film can prevent the appearance of the polishing scars. With regard to its upper limit, no specific value is set, and it is limited by the deposition time and polishing time for the reinforcing film. If the film thickness is not greater than 400 nm. no special problem arises.

For the reinforcement, the reinforcing film formed through an isotropic growth makes the acute angle section of the projecting top end thick and smooth, the projecting end being formed on the highly anisotropic film. Further, the thickness of the HDP film becomes thin around the edge section of the nitride film 3 at the bottom of the projection of the HDP film. By forming the reinforcing film, the film thickness around this edge section increases and the reinforcement is made. As a result, when polishing by the CMP with a ceria slurry is carried out, even if some of the polishing grains change into large particles by aggregation, the projecting section cannot be broken while being polished so that the appearance of the polishing scar can be well suppressed.

In the second embodiment of the present invention, after performing the first polishing in which, using a slurry containing grains of small particle size which do not make aggregation, a CMP polishing is made till the top end section of the projection disappears, another CMP polishing with a ceria slurry is performed.

Because the slurry used in the first polishing contains grains of small particle size, which make no aggregation, the projections become unlikely to be broken while being polished. Furthermore, after the top end of the projection is polished, another polishing is performed, using a ceria slurry which provides a high selection ratio of the polishing rate with respect to the nitride film, the polishing accuracy can be improved and, at the same time, the appearance of the polishing scars can be well suppressed.

In the third embodiment, after forming a film to reinforce the projection as described in the first embodiment, the first polishing in which a CMP polishing is carried out, using a slurry containing grains of small particle size which do not make aggregation is made, and thereafter another CMP polishing with a ceria slurry is performed, in the same way as in the second embodiment.

In this case, the polishing scars do not appear at all.

From the first to the third embodiments, it is preferable to set a polishing stopper film on the upper level section in order to heighten the controllability of the CMP polishing. The polishing rate for the polishing stopper film must be, at least, less than that for the HDP film.

In the case of the CMP polishing with a ceria slurry, if an oxide film and a nitride film are used as the HDP film and the polishing stopper film, respectively, a selection ratio of the polishing rate of 20 to 60 can be obtained.

EXAMPLE 1

First Example of the present invention is described below with reference to FIGS. 1(a) to (g), which is a series of schematic cross-sectional views of a semiconductor substrate illustrating the steps thereof.

First, as shown in FIG. 1(a), on a semiconductor substrate 1, a thermal oxide film 2 was grown to a thickness of 10 nm and thereon a nitride film 3 was grown to a thickness of 140 nm by the low pressure CVD method and, then, a KrF resist 4 was formed on an element formation region by means of KrF excimer lithography. Next, as shown in FIG. 1(b), using th KrF resist as a mask, the nitride film 3 was first etched by the plasma etching to make the nitride film 3a remain selectively on the element formation region.

The thermal oxide film 2 could be hereat removed together by etching, or alternatively it could be removed when a portion of the semiconductor substrate 1 was removed by etching, as described below.

After the KrF resist 4 was removed, as shown in FIG. 1(c), using the nitride film 3a as a mask, plasma etching was applied thereto to form trenches with a depth of 250 nm in the element isolation regions of the underlying semiconductor substrate 1. The nitride film 3a was, hereat, etched by 40 nm to a thickness of 100 nm. Next, as shown in FIG. 1(d), after conducting a cleaning treatment such as an acid cleaning, a HDP oxide film 5 was grown to a thickness of 400 nm so as to fill up these trench sections.

The HDP oxide film 5, hereat, took the shape of a long tall in the periphery of the element formation region. The tail of the HDP oxide film 5 made an angle of 56° to the surface of the semiconductor substrate. Further, the HDP oxide film 5 over the element formation region became trapezoidal when the width of the element formation region was large. When the width of the region was less than 540 nm (=2×400/tan 56°), however, the upper side of the trapezoid disappeared and the HDP oxide film took the shape of an isosceles triangle with an apical angle of 68°.

Next, as shown in FIG. 1(e), a plasma oxide film 6 was grown to a thickness of 200 nm so as to cover and reinforce the projection of the HDP oxide film. On this occasion, the film to cover and reinforce the projection of the HDP oxide film had to be a film capable to make isotropic covering. Any oxide film grown by the atmospheric CVD, the LP (Low Pressure)-CVD, the plasma CVD and the like might be utilized for that. Further, although the film could not be perfectly isotropic, the film could be grown continuously, making the deposition conditions of the HDP oxide film 5 more isotropic, after the trench was filled up as described above. The film could be any other film as long as it had a good adhesiveness and a polishing rate equivalent to that for the HDP oxide film so as not to peel off or form steps on the polishing surface. It was not necessarily required to be an oxide film but an oxide film grown by the atmospheric CVD, the LP-CVD, the plasma CVD or the like was the most suitable, because it had a polishing rate equivalent to that for the HDP oxide film as well as a good adhesiveness.

Next, as shown in FIG. 1(f), using the nitride film 3a as a polishing stopper, the HDP film 5 and the plasma oxide film 6 lying on the element formation region were removed by the CMP polishing with a ceria slurry to expose the nitride film 3a.

The ceria slurry was hereat prepared by mixing a ceria grain agent HS-8005 and an additive HS-8102GP (made by Hitachi Chemical Co. Ltd.,) in the proportion of 1:2, and a CMP apparatus MIRRA 3400 (made by Applied Materials Inc.) and a polishing pad IC 1000 (made by Rodel Nitta Company) were utilized, but obviously they were not limited to these particular ones. As for the detection of the end point for the CMP polishing, the optical method was hereat employed. The amount of polishing the nitride film received did not exceed 5 nm, indicating a high controllability this slurry provided.

Next, as shown in FIG. 1(g), the nitride film 3a was removed by wet etching with phosphoric acid, and thereby the formation of the trench isolation was accomplished. Typically, few polishing scars like scooped marks were observed on the semiconductor substrate with a minute pattern.

Figure 2:
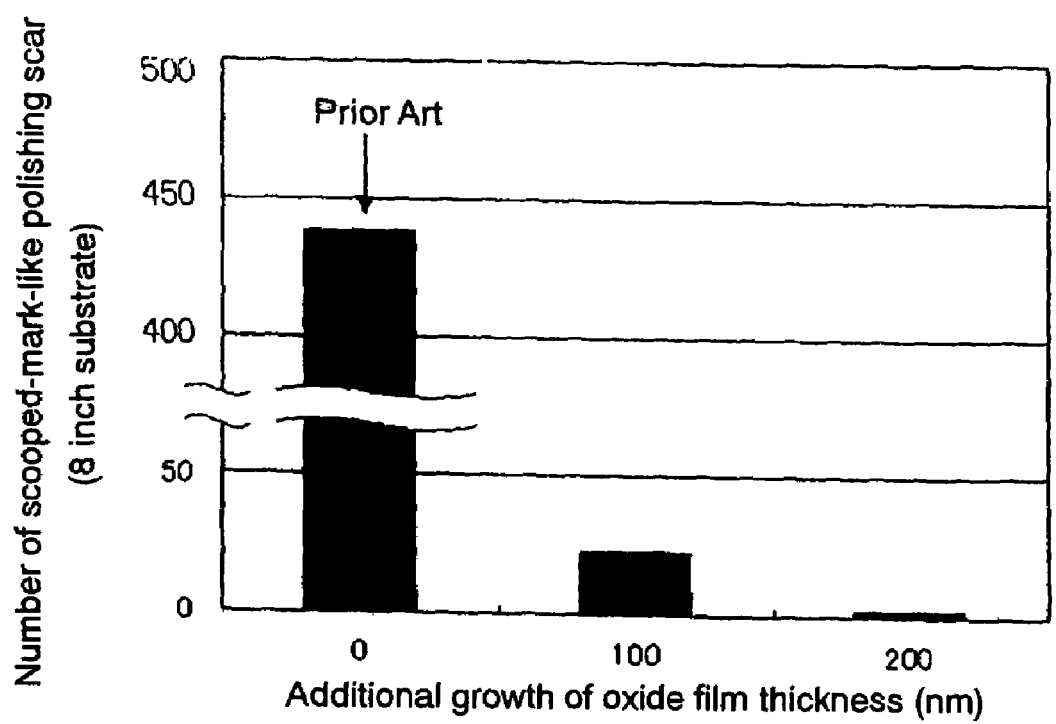
FIG. 2 is a diagram showing the state of appearance of the polished scars like scooped marks for First Example and Second Example.

FIG. 2 shows the result of the investigation in which the appearance of the polishing scars was studied for the plasma oxide films with various film thicknesses. As shown in FIG. 2, with a thickness of not less than 100 nm, the plasma oxide film 6 covering and reinforcing the HDP film which comprises the projections could prevent the appearance of the polishing scars. With regard to its upper limit, no specific value was set, and it was limited by the deposition time and polishing time for the reinforcing film. If the film thickness was not greater than 400 nm, no special problem arose.

EXAMPLE 2

Second Example of the present invention is described below with reference to FIGS. 3(a) to (d), which is a series of schematic cross-sectional views of a semiconductor substrate illustrating the steps thereof.

Figure 3:
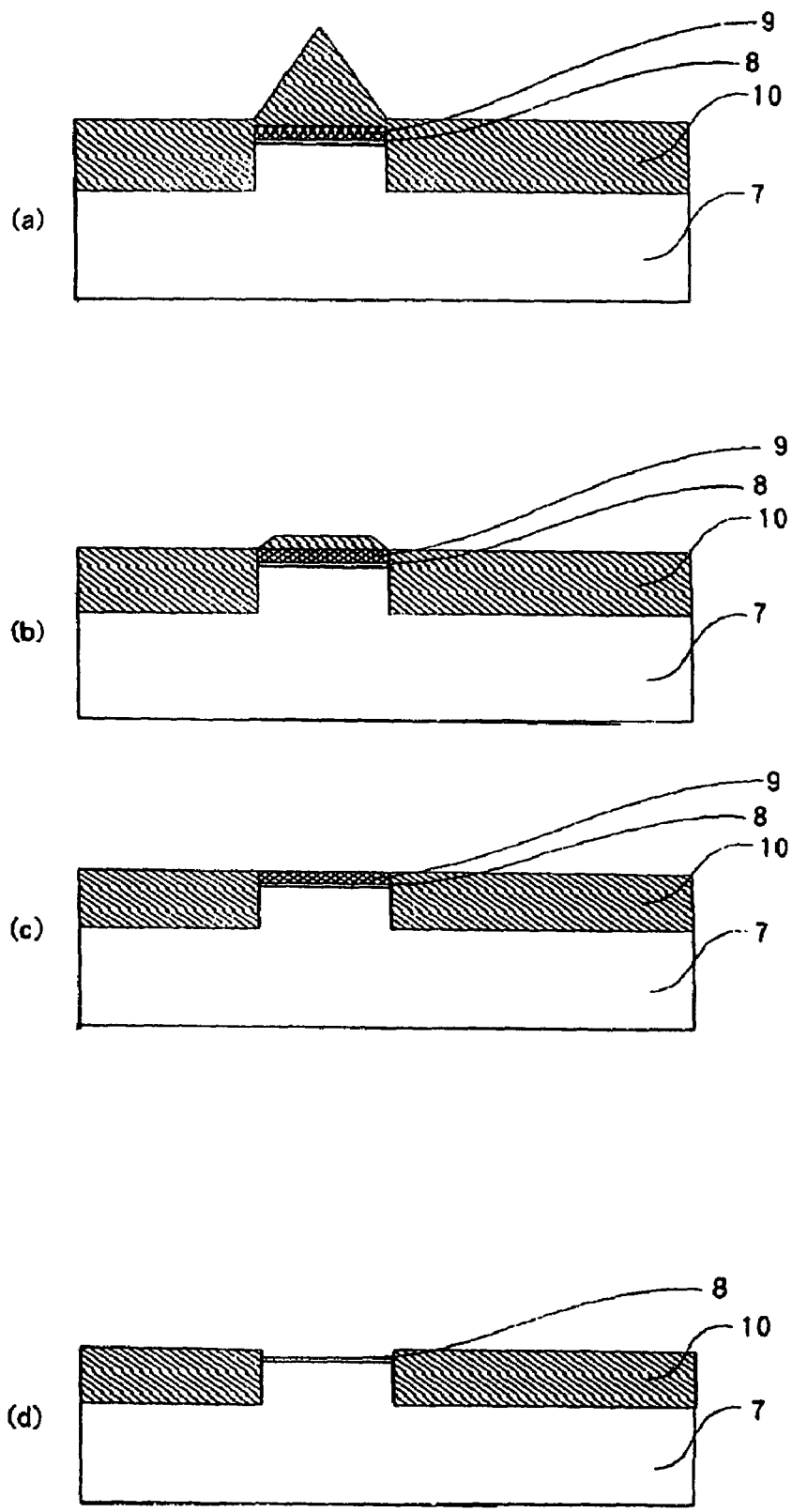
FIG. 3 is a series of schematic cross-sectional views of a semiconductor substrate illustrating the steps of Second Example.

FIG. 3(a) is the same as FIG. 1(d), showing a semiconductor substrate and other films formed thereon. The CMP polishing with a silica slurry was applied thereto and, as shown in FIG. 3(b), an angular section of a projection of a HDP oxide film 10 was removed.

As the silica slurry, silica slurry made by Cabot Co. was used, and a CMP apparatus MIRRA 3400 (made by Applied Materials Inc.) and a polishing pad IC 1000 (made by Rodel Nitta Company) were utilized, but obviously they were not limited to these particular ones. Although the longer the polishing time period was set, the more the reducing effect on the polishing scars could be obtained, attention was needed not to polish the nitride films 9, as well, in respect of the controllability. On this occasion, the polishing time period was set to be 15 seconds.

Since the grain size of the silica slurry was small, even if cone-shaped projections were present on the HDP oxide film, the polishing therewith could be carried out without breaking projections.

Next, as shown in FIG. 3(c), using a nitride film 9 as a polishing stopper film, a polishing by the CMP with a ceria slurry was applied to a HDP film 10 till the nitride film was exposed.

The amount of the polishing the nitride film received did not exceed 5 nm, indicating a high controllability of this polishing. The manufacturability and the polishing stability considered, these two polishing were preferably performed successively on two different tables within the same apparatus but could be made separately In two different apparatuses. Nevertheless, if they were performed on one polishing table, two types of the slurries might mingle on one and the same polishing table and, by experience, the stability was more than likely to be lost.

Next, as shown in FIG. 3(d), the nitride film 9 was removed by wet etching with phosphoric acid, and thereby the formation of the trench isolation was accomplished. Typically, only a few polishing scars like scooped marks were observed on the minute element formation regions.

It was inferred that the breaking of the triangular section was particularly liable to happen in the initial period of the polishing, while the aspect ratio was large. Accordingly, by using a slurry containing grains of small particle size which did not change into large particles by aggregation, for instance, a silica slurry, for the polishing in the initial period, the appearance of the polishing scars could be reduced further.

EXAMPLE 3

Third Example of the present invention is described below, referring to the drawings. Third Example is a combination of First Example and Second Example.

FIGS. 4(a) to (d) are a series of schematic cross-sectional views of a semiconductor substrate illustrating the steps of Third Example.

Figure 4:
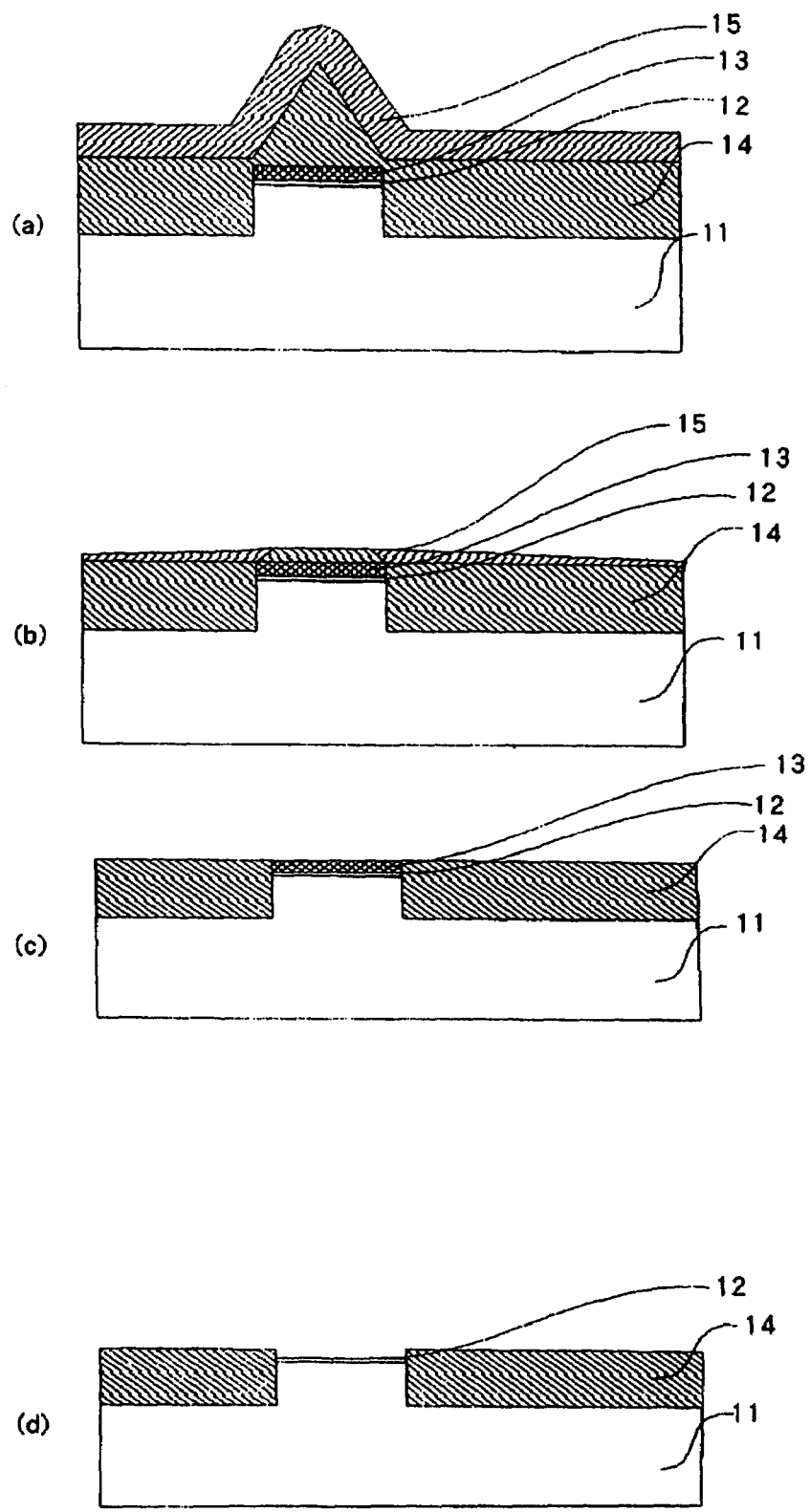
FIG. 4 is a series of schematic cross-sectional views of a semiconductor substrate illustrating the steps of Third Example.
Figure 5:
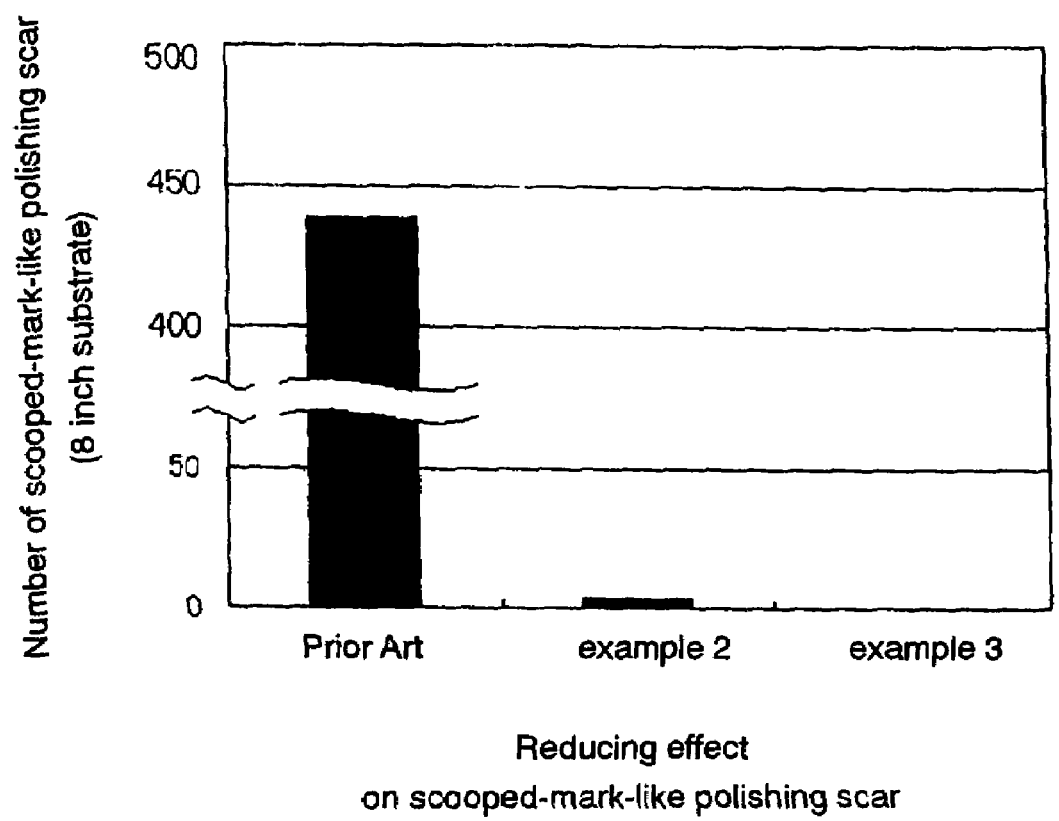
FIG. 5 is a diagram showing the state of appearance of the polished scars like scooped marks for Second Example, Third Example and Prior Art.

FIG. 4(a) is the same as FIG. 1(e). A plasma oxide film 15 with a thickness of 200 nm was firstly formed on a HDP oxide film 14. Next, as shown in FIG. 4(b), a CMP polishing with a silica slurry made by Cabot Co. was performed for 50 seconds to remove an angular section of a projection of a HDP oxide film 14. Because the plasma oxide film 15 was present unlike Second Example, even if a polishing time period was somewhat long, the nitride film 13 could not be exposed. Next, as shown in FIG. 4(c), using the nitride film 13 as a polishing stopper film, a polishing by the CMP with a ceria slurry was applied to the HDP film 14 till the nitride film 13 was exposed. The amount of the polishing the nitride film received did not exceed 5 nm, indicating a high controllability of this polishing. Next, as shown in FIG. 4(d), the nitride film 13 was removed by wet etching with phosphoric acid, and thereby the formation of the trench isolation was accomplished. Typically, none of the polishing scars like scooped marks was observed on the minute element formation regions. FIG. 5 is a graphical representation showing the comparison of the number of the polishing scars like scooped marks between Second Example and Third Example.

Although the description in Examples 1 to 3 is made, taking the case of the trench isolation, it is to be understood that the present invention is not limited, in its application, to the trench isolation. It will be obvious to those skilled in the art that the present invention can be applied to any case in which a CMP polishing with a ceria slurry is made for a projection being formed when a deposition of a HDP oxide film is applied to a basic substance whose surface has a difference in level.

Further, apart from the HDP oxide film, the present invention may be also applied to the case in which projections are formed on a film such as a HDP nitride film that is formed, on the surface having a difference in level, under the anisotropic deposition conditions.

EXAMPLE 4

Figure 6:
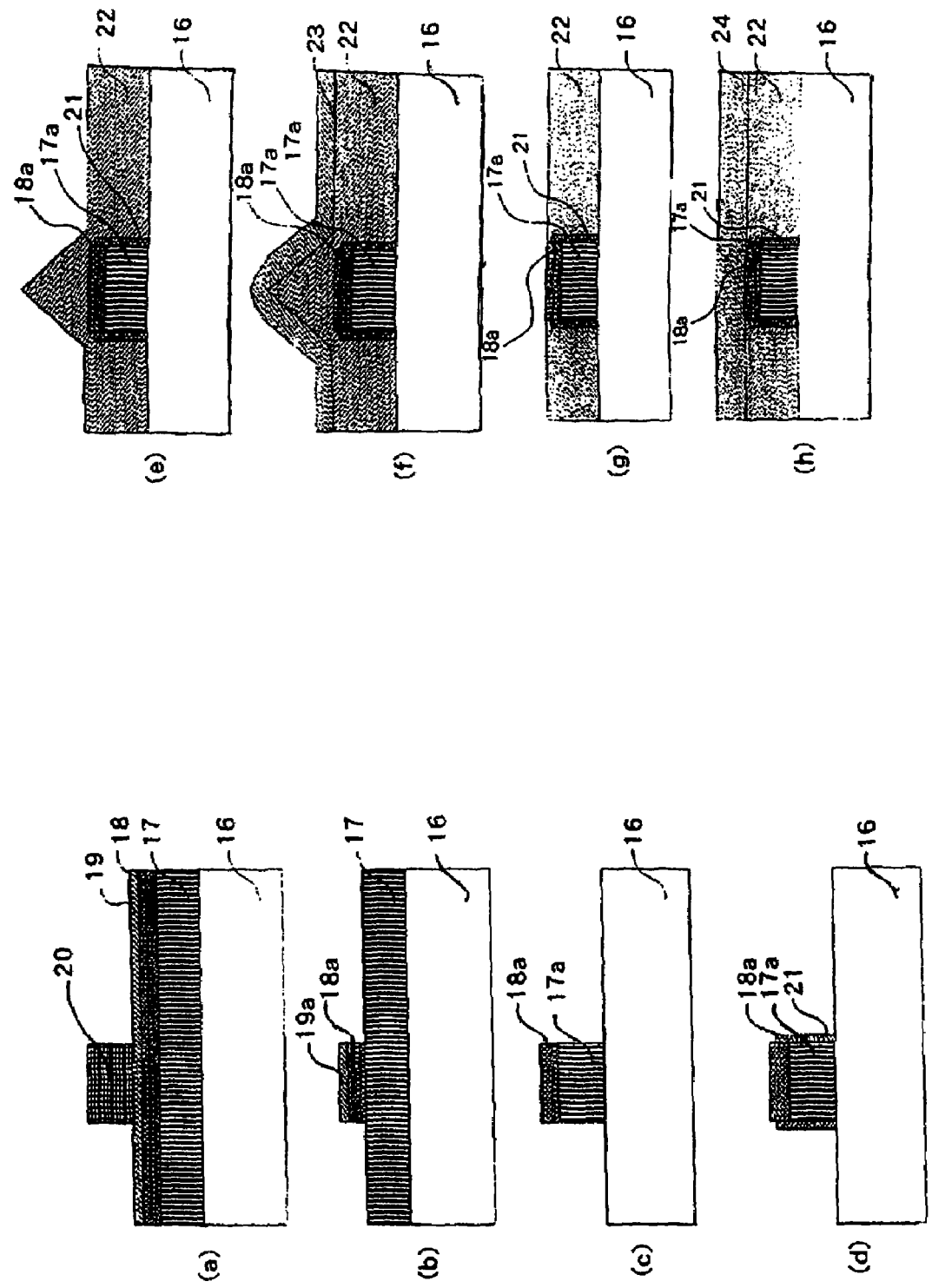
FIG. 6 is a series of schematic cross-sectional views of a semiconductor substrate illustrating the steps of Fourth Example.
Figure 7:
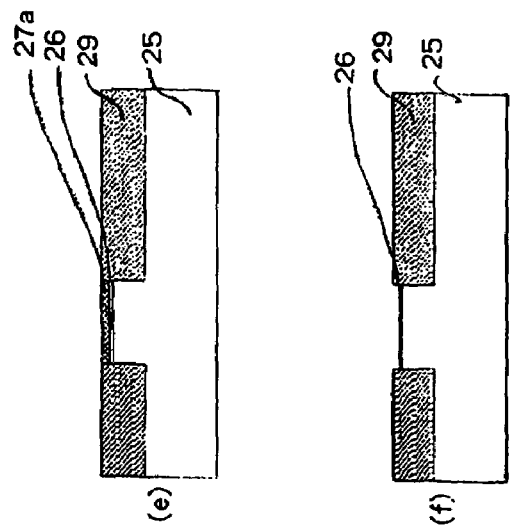
FIG. 7 is a series of schematic cross-sectional views of a semiconductor substrate illustrating the steps of Prior Art.
Figure 7:
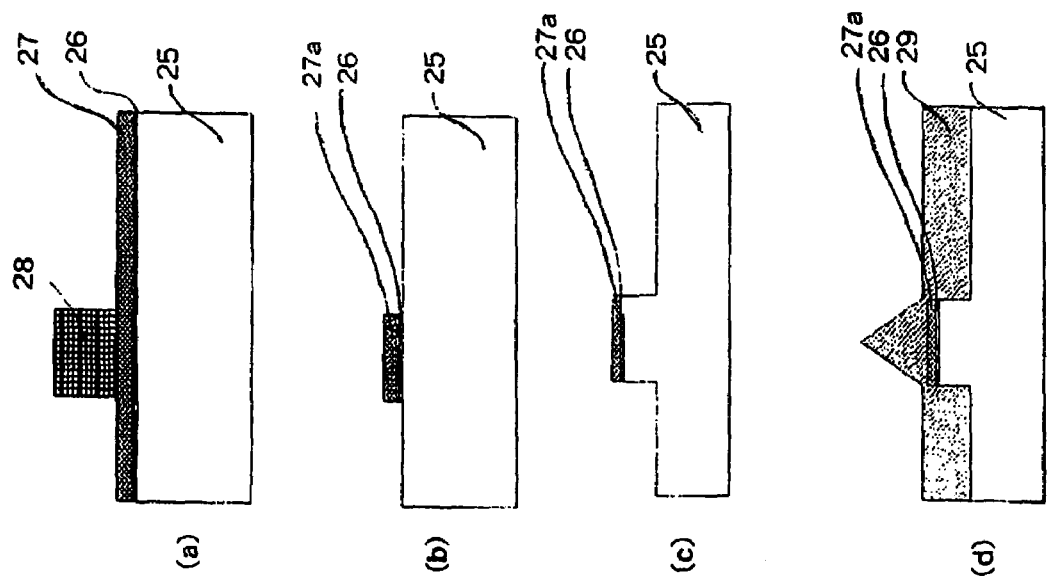

FIG. 6 is a series of schematic cross-sectional views of a semiconductor substrat illustrating the steps of Fourth Example.

As shown in FIG. 6(a), on an underlying interlayer insulating film 16, tungsten 17 for interconnection was grown to a thickness of 500 nm, and a nitride film 18, 180 nm thick, and an oxide film 19, 100 nm thick, were then grown thereon. Next, a KrF resist pattern 20 was formed in an interconnection region.

Next, as shown in FIG. 6(b), using the KrF resist pattern 20 as a mask, portions of the oxide film and the nitride film lying in non-interconnection regions were first removed selectively by plasma etching and thereafter the KrF resist pattern was removed. Next, as shown in FIG. 6(c), using a plasma oxide film 19a as a mask, portions of the tungsten lying in the non-interconnection regions were removed by plasma etching. Next, as shown in FIG. 6(d), a nitride film was grown to a thickness of 45 nm over the entire surface, and then etch back was applied thereto to form nitride film sidewalls 21 on the lateral faces of the interconnection. The nitride film sidewalls 21 were set for forming a contact in a manner of self-alignment, at a later stage, and not particularly connected with the teaching of the present invention.

Next, as shown in FIG. 6(e), a HDP oxide film 22 was grown to a thickness of 700 nm. On a minute interconnection regions, a projection made of the HDP oxide film was formed. Next, as shown in FIG. 6(f), a plasma oxide film 23 was grown to a thickness of 200 nm. Next, as shown in FIG. 6(g), a polishing with a cerla slurry was carried out till the nitride film 18a was exposed. In this way, while preventing the polishing scars like scooped marks being produced by the breaking of the angular section of the projection formed on the HDP oxide film, the CMP with a good controllability could be conducted. Although the present example employed a method of First Example in which a plasma oxide film was grown to reinforce th projections, it is apparent that the planarization could be made, as in Second Example, by performing the first polishing with a silica slurry and the second polishing with a ceria slurry, or, as in Third Example, by forming a plasma oxide film to reinforce the projections and thereafter performing the first polishing with a silica slurry and the second polishing with a ceria slurry.

Finally, as shown in FIG. 6(h), as the insulating film, a plasma oxide film 24 was grown.

In the above description of Examples, the nitride film was used as the polishing stopper for the HDP oxide film, but, it is apparent that the polishing stopper film was not required only if the polishing scars produced while being polished were to be prevented.

The present invention can provide a technique to planarize the substrate without having scars like scooped marks on the substrate surface, which might be brought about by projections in the shape of a mesa, a peaked roof or a cane, being formed on a high density plasma oxide film, while using a high density plasma oxide film with a high filling-up capability and a ceria slurry with a high polishing accuracy.

What is claimed is:

1. A method of manufacturing a semiconductor device, which comprises:
   depositing, on a basic substance surface with a difference in level, a first film through an anisotropic growth;
   forming, through an isotropic growth, a second film, having a polishing rate equivalent to or less than a polishing rate of said first film, to reinforce a projection formed on said first film; and
   polishing said first film and said second film using a ceria slurry.

2. The method of manufacturing a semiconductor device according to claim 1, wherein said difference in level comprises a trench.

3. The method of manufacturing a semiconductor device according to claim 1, wherein said difference in level comprises an interconnection.

4. The method of manufacturing a semiconductor device according to claim 1, wherein a stopper film which is to act as a polishing stopper, having a polishing rate less than a polishing rate of said first film, is formed on an upper level section constituting said difference in level.

5. The method of manufacturing a semiconductor device according to claim 4, wherein said first film and said second film both comprise oxide films and said stopper film comprises a nitride film.

6. The method of manufacturing a semiconductor device according to claim 1, wherein said first film comprises a film formed by a high density plasma Chemical Vapor Deposition method.

7. The method of manufacturing a semiconductor device according to claim 1, wherein said second film comprises a film formed by one of an atmospheric chemical vapor deposition method, a low pressure chemical vapor deposition method, and a plasma chemical vapor deposition method.

8. The method of claim 1, further comprising polishing said first film and said second film using a slurry whose grains do not make aggregation before said polishing said first film and said second film using said ceria slurry.

9. The method of claim 1, wherein the polishing rate of the first film and the second film are within twenty percent of each other.

10. The method of claim 1, wherein a thickness of said second film is not less than about 100 nm.

11. The method of claim 1, wherein a thickness of said second film is not greater than about 400 nm.

12. The method of claim 1, further comprising forming a stopper film on an upper level section constituting said difference in level.

13. The method of claim 12, wherein said first film and said second film both comprise oxide films and said stopper film comprises a nitride film.

14. The method of claim 1, wherein said isotropically growing of said second film comprises forming said second film by at least one of an atmospheric chemical vapor deposition method, a low pressure chemical vapor deposition method, and a plasma chemical vapor deposition method.

15. A method of manufacturing a semiconductor device, the method comprising:
   anisotropically growing a first film on a substance surface having differences in level;
   isotropically growing a second film which reinforces a projection on said first film, wherein said second film has a polishing rate that is equal to or less than a polishing rate of said first film; and
   polishing said first film and said second film using a ceria slurry.

16. The method of claim 15, wherein said difference in level comprises a trench.

17. The method of claim 15, wherein said difference in level comprises an interconnection.

18. The method of claim 15, wherein said anisotropically growing of said first film comprises a high density plasma chemical vapor deposition method.

* * * * *